United States Patent
Van De Beek et al.

(10) Patent No.: US 7,218,157 B2
(45) Date of Patent: May 15, 2007

(54) PHASE LOCKED LOOP

(75) Inventors: Remco Cornelis Herman Van De Beek, Enschede (NL); Eric Antonius Maria Klumperink, Lichtenvoorde (NL); Bram Nauta, Borne (NL); Cicero Silveira Vaucher, Eindhoven (NL)

(73) Assignee: NXP B.V., Eindhoven (NL)

( * ) Notice: Subject to any disclaimer, the term of this patent is extended or adjusted under 35 U.S.C. 154(b) by 48 days.

(21) Appl. No.: 10/525,862

(22) PCT Filed: Jul. 31, 2003

(86) PCT No.: PCT/IB03/03726

§ 371 (c)(1),
(2), (4) Date: Feb. 25, 2005

(87) PCT Pub. No.: WO2004/021574

PCT Pub. Date: Mar. 11, 2004

(65) Prior Publication Data

US 2006/0164137 A1    Jul. 27, 2006

(30) Foreign Application Priority Data

Aug. 30, 2002   (EP) ................................. 02078579

(51) Int. Cl.
*H03L 7/06* (2006.01)

(52) U.S. Cl. ...................................... 327/156; 327/147

(58) Field of Classification Search ................ 327/147, 327/156
See application file for complete search history.

(56) References Cited

U.S. PATENT DOCUMENTS

| 6,072,370 | A  | * | 6/2000  | Nakamura ................... 331/25 |
| 6,075,416 | A  | * | 6/2000  | Dalmia ........................ 331/25 |
| 6,642,747 | B1 | * | 11/2003 | Chiu ........................... 327/40 |
| 6,683,930 | B1 | * | 1/2004  | Dalmia ........................ 375/376 |
| 6,915,081 | B2 | * | 7/2005  | Takeshita et al. ............ 398/188 |
| 2002/0053950 | A1 | * | 5/2002 | Takeshita et al. ............. 331/17 |

FOREIGN PATENT DOCUMENTS

| GB | 1 496 397 |   | 12/1977 |
| GB | 2253316   | * | 2/1992  |
| GB | 2 253 316 |   | 9/1992  |

OTHER PUBLICATIONS

Afonso J et al: "A Phase-Locked Loop with Digital Frequency Comparator for Timing Signal Recovery", National Telecommunications Conference. Washington, DC, Nov. 27-29, 1979.

* cited by examiner

*Primary Examiner*—Long Nguyen
*Assistant Examiner*—Ryan C. Jager
(74) *Attorney, Agent, or Firm*—Peter Zawilski

(57) ABSTRACT

A phase locked loop comprising a phase detector (100) for determining a phase difference between a reference signal (Ref) and mutually phase shifted signals (I, Q) to generate frequency control signals (U, D), the phase detector (100) comprising: means (10) for obtaining a first one of said frequency control signals (U, D) by binary multiplication of the reference signal (Ref) and one of the relative phase shifted signals (I, Q); and means (20) for obtaining a second one of said frequency control signals (U, D) by binary multiplication of the relative phase shifted signals (I, Q).

2 Claims, 5 Drawing Sheets

PHASE LOCKED LOOP

The invention relates to a phase locked loop comprising a phase detector for determining a phase difference between a reference signal and mutually phase shifted signals to generate frequency control signals.

Phase Locked Loops (PLLs) are well known, as basic building blocks in e.g. tuning systems for receivers and as clock multipliers in optical systems. The constituents of a PLL circuit are often integrated on a same chip. Normally, a PLL comprises a ring coupling of a voltage-controlled oscillator (VCO), phase-frequency detector (PFD), a charge pump and a loop filter. The PFD detector, which comprises phase and frequency detectors, provides signals that drive the charge pump and indicate frequency and phase differences between a reference signal and a signal that is proportional with the signal generated by the VCO.

U.S. Pat. No. 5,892,380 describes a phase-frequency detector comprising first and second D latches coupled to a combinatorial circuit comprising logical AND coupled to buffer gates. The combinatorial circuit has a first input coupled to an output of the first D latch and a second input coupled to an output of the second latch. Each of the two latches has an asynchronous reset input, a reset signal being generated by the combinatorial circuit. It is observed that the combinatorial circuit is a feedback circuit. An advantage of this circuit is that it provides both phase and frequency detection. It usually generates little reference breakthrough as compared to other detectors. Furthermore, the two latches are edge triggered that makes the phase detection performance independent of the duty cycle of the signals on the detector inputs. A main disadvantage of this type of phase detector is that it has an important operation speed limitation due to the feedback combinatorial circuit that generates the reset signal. A maximum frequency operation of the phase detector is determined by a time delay including a delay of the combinatorial circuit and a propagation time inside the D latches. The consequence of this maximum frequency operation is a limitation of the frequency of a reference signal that is supplied to the PLL.

It is therefore an object of the present invention to provide a phase detector that enables using of a relatively high frequency reference signal and therefore increasing the maximum operation frequency of a PLL.

In accordance with the invention this is achieved in a PLL as described in the introductory paragraph which is characterized in that the phase detector comprises means for obtaining a first one of said frequency control signals by binary multiplication of the reference signal and one of the relative phase shifted signals and means for obtaining a second one of said frequency control signals by binary multiplication of the relative phase shifted signals. The product of signals is realized with combinatorial AND gates. Because there are no flip-flops and no combinatorial feedback, the phase detector according to the invention has a relative higher frequency of operation than that described in the prior art.

In an embodiment of the invention the relative phase shifted signals are generated by a splitter having an input signal generated by a voltage controlled oscillator coupled to the first charge pump and to the loop filter. The signal generated by the voltage-controlled oscillator is splitted into two components having a relative same frequency and a relative phase shift. The splitted signals are inputted into the phase detector described in the previous paragraph. Ideally, the phase difference between the splitted signals is 90 degrees for obtaining the maximum linearity range of the phase detector. It is observed from simulations and experimentally determined that the 90 degrees phase shift between the splitted signals is not critical. Furthermore, because the phase detector is not dependent on a duty cycle of the signals, the duty cycle of the signals generated by the splitter could be between 25% and 75%. Hence, the splitter could be implemented using relatively cheap components, reducing the overall cost of the PLL.

In another embodiment of the invention, the splitter comprises a binary divider receiving a signal generated by the voltage controlled oscillator and generates a binary signal used as a clock signal for a divide by two circuit comprising a first flip-flop ring-coupled to a second flip-flop, said flip-flops generating the relative phase shifted signals. The two flip-flops are edge triggered, the first flip-flop being triggered at a transition between a 1 state and a 0 state, the second flip-flop being triggered at a transition between a 0 state to a 1 state. The configuration allows a relatively high frequency of operation the signals generated being relatively in quadrature.

An even simpler solution could be applied when the splitter is directly coupled to the output of the VCO and therefore it is working at a relatively high frequency as presented in another embodiment of the invention. In this situation a delay line coupled to an inverter could be used. Delay lines are easily implemented in a chip when relative high frequency signals as that used in optical communications are involved. Because the relative phase shift between the signals and their duty cycles are not critical the solution using delay lines is a relative inexpensive solution contributing to obtaining a relative cheap PLL.

As it was previously stated, a maximum linearity range of the phase detector is obtained when the splitted signals have a relative phase shift of 90 degrees i.e. quadrature signals. A relative simple way for obtaining quadrature signals is using of a quadrature oscillator. The,quadrature oscillator generates signals substantially relative phase shifted with 90 degrees. Recalling that the quadrature phase shift is not critical for the PLL and therefore the design parameters of the quadrature oscillator are less critical. Hence, the quadrature oscillator is easier to be implemented than a quadrature oscillator having high performance technical requests.

In another embodiment of the invention the phase locked loop flurther comprises a frequency detector receiving the reference signal and the relative phase shifted signals for generating an up frequency detector signal and a down frequency detector signal. The signals generated by the frequency detector are inputted to a first charge pump coupled to the loop filter. Preferably, the frequency detector comprises a third flip-flop and a fourth flip-flop driven by the reference signal and having at their inputs the relative phase shifted signals. The outputs of the flip-flops are coupled to input terminals of fifth flip-flop. The frequency detector generates the up frequency detector signal obtained by binary multiplication between a signal generated by the fifth flip-flop at it's output and the signal obtained at the bar-output of the fourth flip-flop. The frequency detector further generates the down frequency detector signal obtained by binary multiplication of the signal obtained at the bar-output of the fourth flip-flop and the signal obtained at the bar-output of the fifth flip-flop signal obtained at the bar-output of the fourth flip-flop. A bar-output signal is relatively in anti-phase with the output signal generated by an output having no bar. Many combinatorial and sequential circuits have a normal and a bar-output e.g. multiplexers, flip-flops etc. Two AND-gates are added to generate signals that can directly control the first charge pump. After achieving phase lock, these signals will remain low, meaning that the first charge pump controlled by these signals do not contribute in the phase noise and spurious signals of the PLL output.

The above and other features and advantages of the invention will be apparent from the following description of exemplary embodiments of the invention with reference to the accompanying drawings, in which.

Figure 3A:
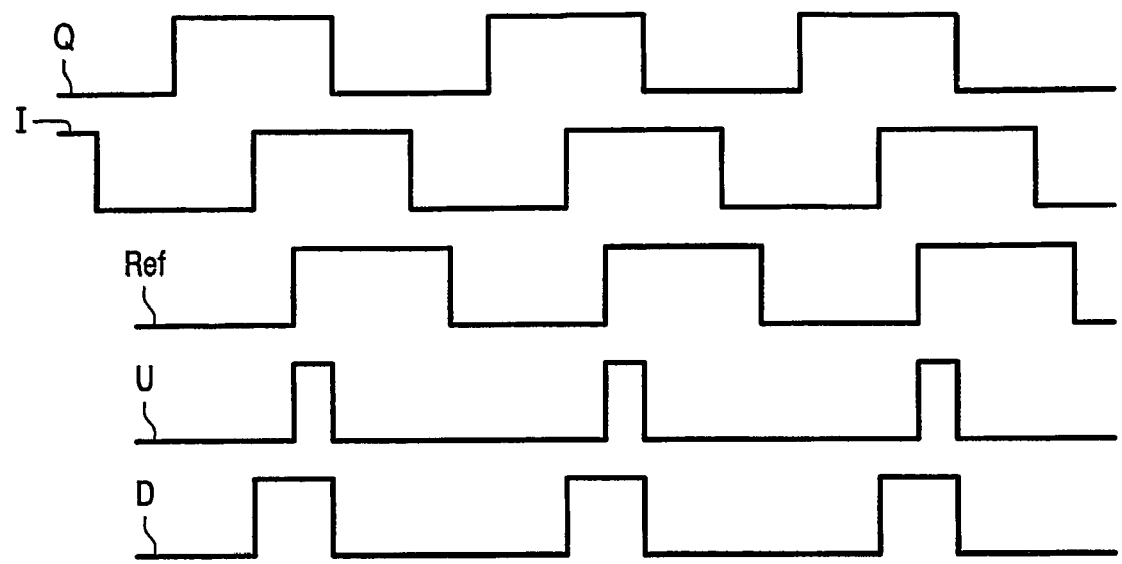
Figure 4A:
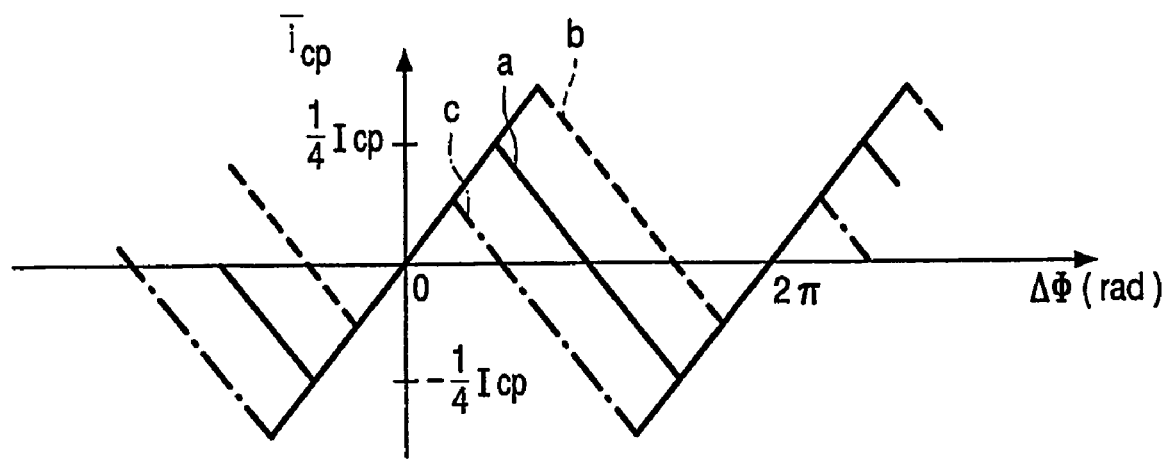
Figure 5:
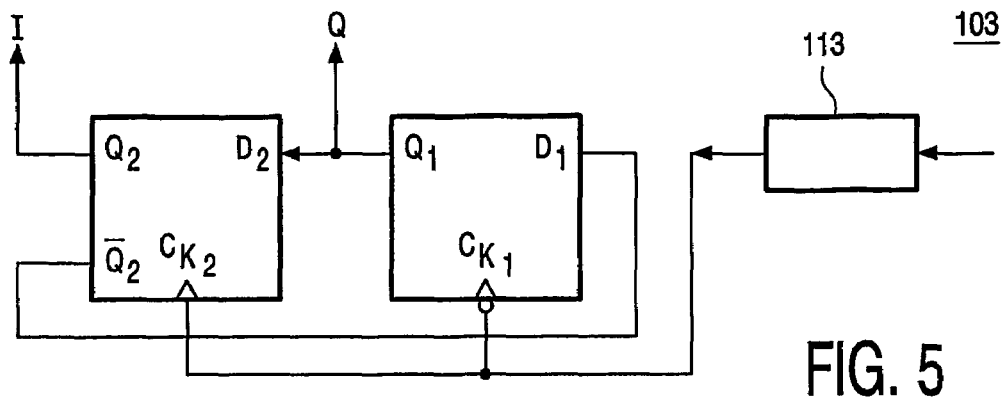
Figure 6:
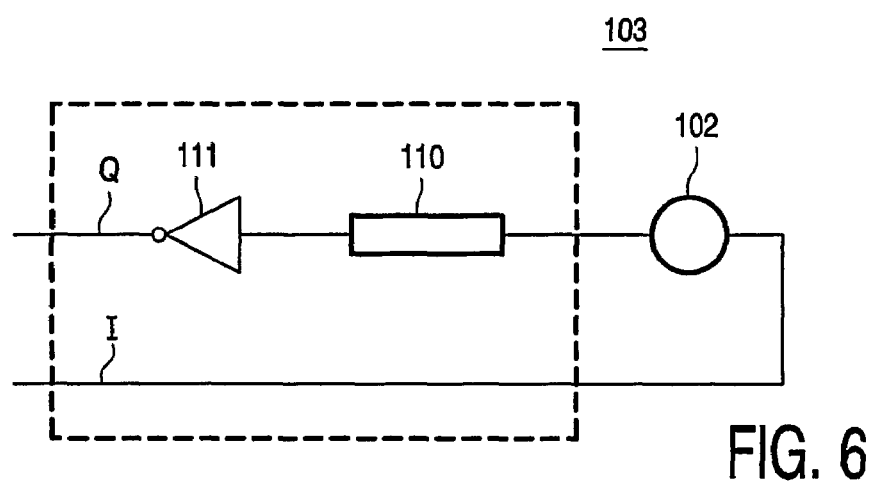
Figure 7:
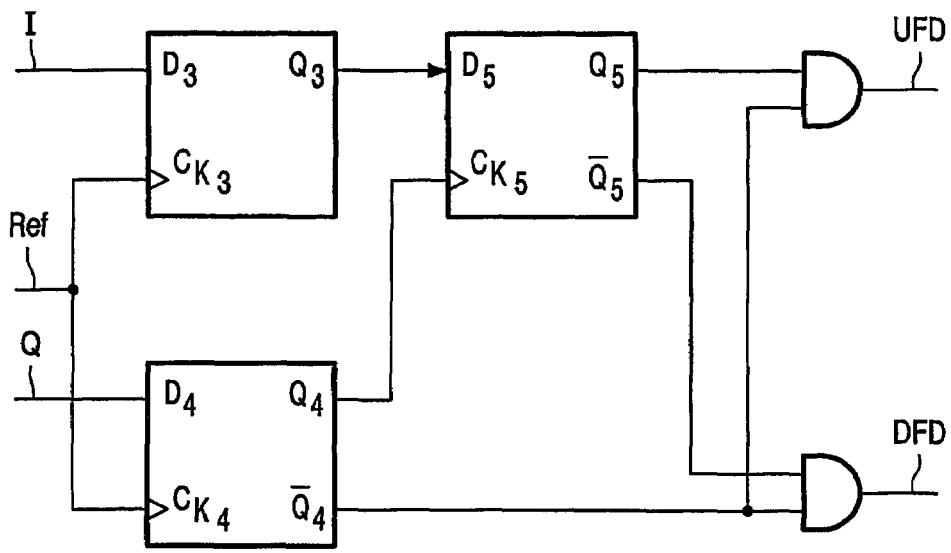
Figure 8:
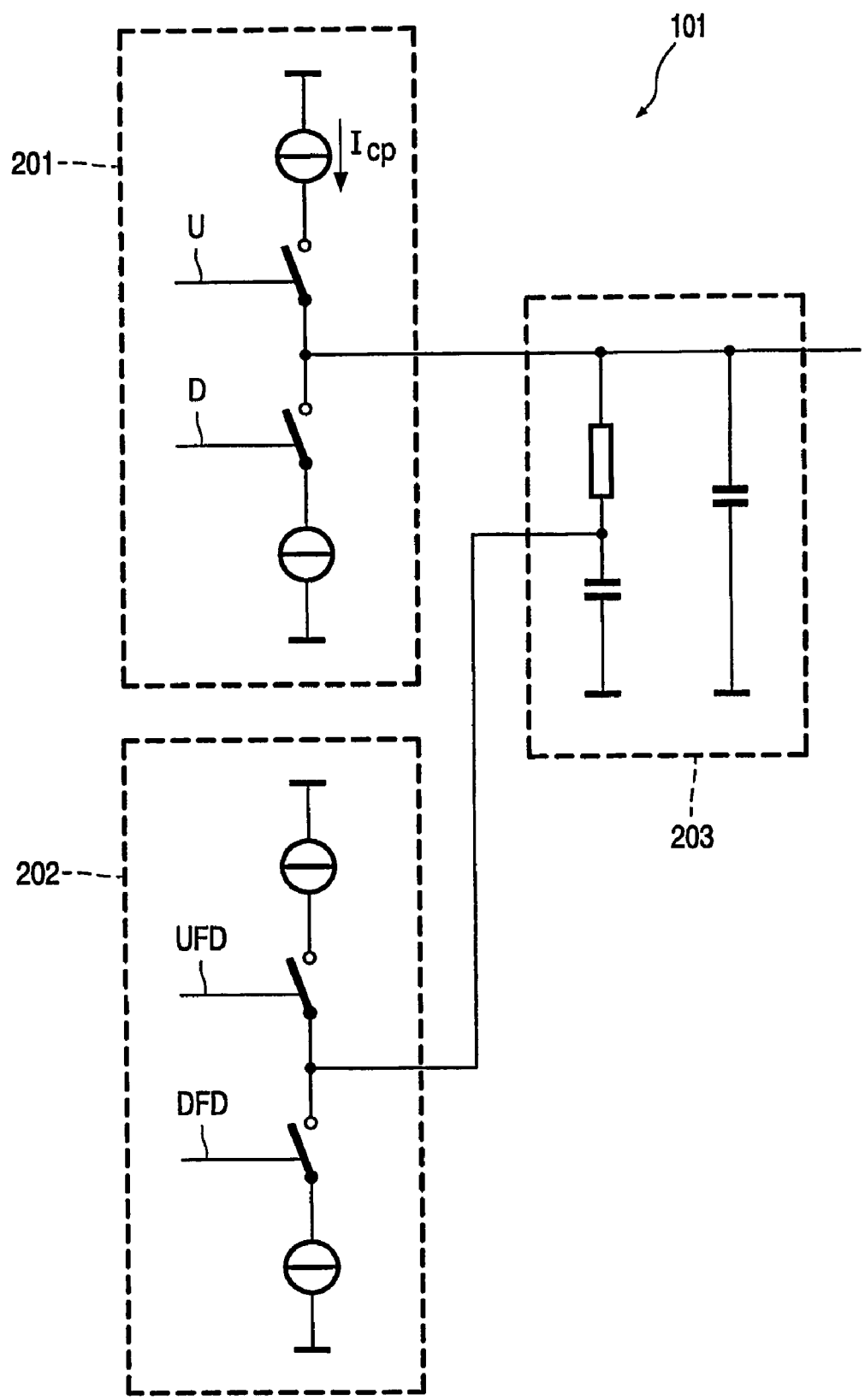

FIGS. 3a and b depict the response of the phase detector to a phase error when a) the signal I leads the reference signal Ref and b) when the signal I lags the reference signal Ref, respectively, FIGS. 4a and b depict mean charge pump current as a function of the phase error a) depending on the phase shift between the splitted signals and b) depending on the duty cycle of the reference signal, respectively, FIG. 5 depicts a signal splitter according to an embodiment of the invention, FIG. 6 depicts another embodiment of the signal splitter according to the invention, FIG. 7 depicts a frequency detector according to an embodiment of the invention, and FIG. 8 depicts the charge pumps and the loop filter, according to the invention.

Figure 1:
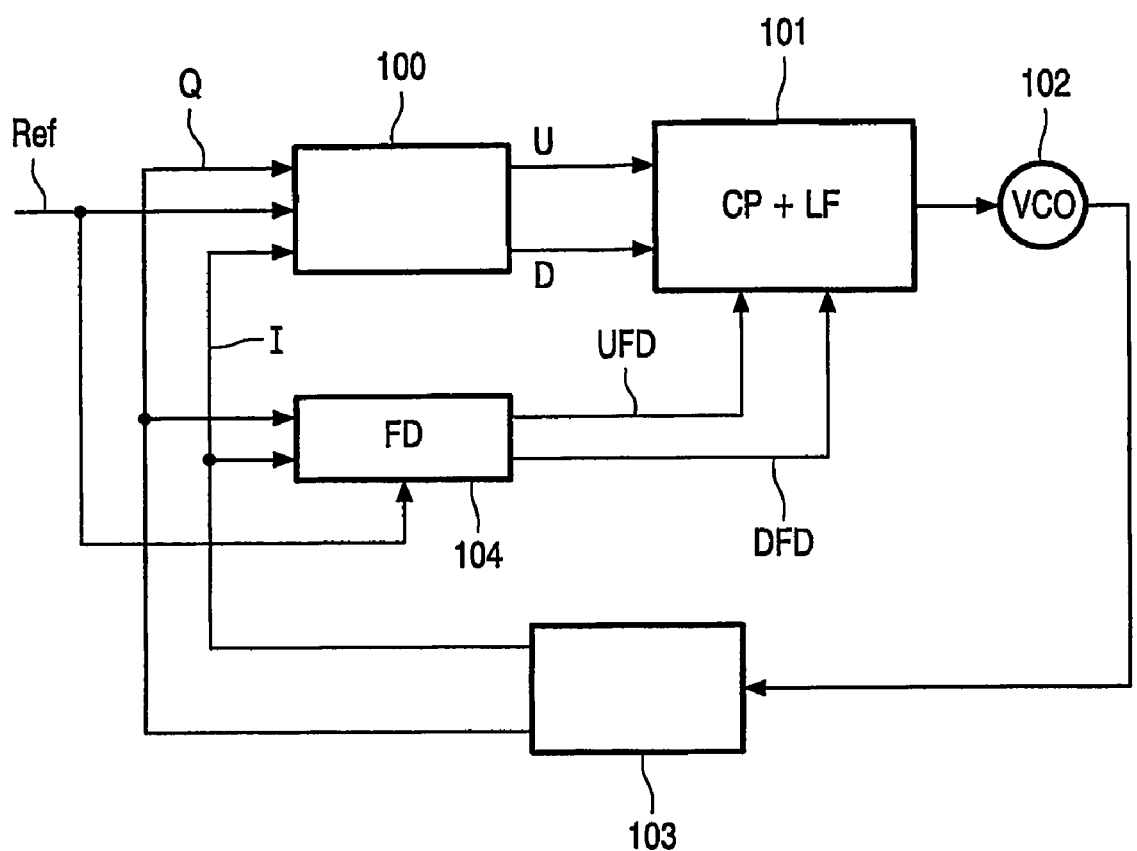
FIG. 1 depicts a phase locked loop according to the invention.
Figure 2:
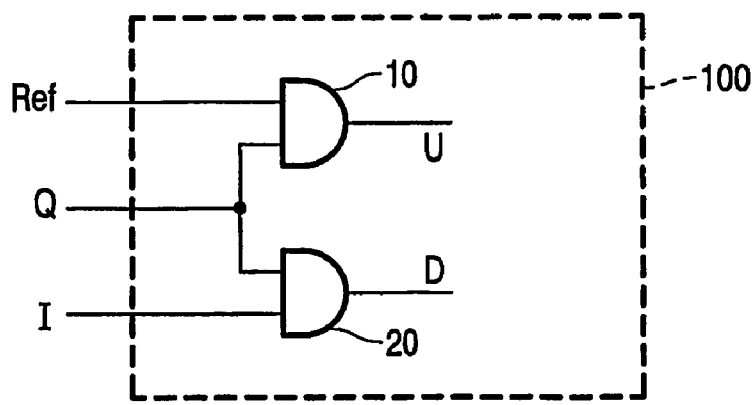
FIG. 2 depicts a phase detector according to an embodiment of the invention.

FIG. 1 depicts a phase locked loop (PLL) according to the invention. The PLL comprises a phase detector 100 for determining a phase difference between a reference signal Ref and relative phase shifted signals I, Q, the phase detector 100 generating an up signal U and a down signal D. The up U and down D signals are supplied to a first charge pump 201 coupled to a loop filter 203 i.e. the block 101. As shown in FIG. 2, in the phase detector 100 the up signal U is obtained by binary multiplication 10 of the reference signal Ref and one of the relative phase shifted signals I, Q and the down signal D is obtained by binary multiplication 20 of the relative phase shifted signals I, Q. Turning back to FIG. 1, the PLL further comprises a frequency detector 104 receiving the reference signal Ref and the relative phase shifted signals I, Q for generating an up frequency detector signal UFD and a down frequency detector signal DFD that are inputted to a second charge pump 202 coupled to the loop filter 203. The PLL flurther comprises a voltage-controlled oscillator (VCO) 102 that provides at its output a signal having a frequency that is controlled by an output signal of the first charge pump 201 coupled to the loop filter 203. The output signal of the VCO 102 is inputted to a splitter 103 for generating the relative phase shifted signals Q and I. The product of signals is realized with combinatorial AND gates as shown in FIG. 2. The signal U is obtained by multiplication of the reference signal Ref and the signal Q. The D signal is obtained by multiplication of the phase shifted signals Q and I. It is observed that the signals U and D could be also obtained as the binary product between signals I, Q and Ref, I or Ref, Q, respectively. The choice depends on the oscillator type used in the PLL. Because there are no flip-flops and no combinatorial feedback, the phase detector according to the invention has a relative higher frequency of operation that described in the prior art. Ideally, the rising edge of the Q signal leads the rising edge of the I signal by 90 degrees.

Figure 3B:
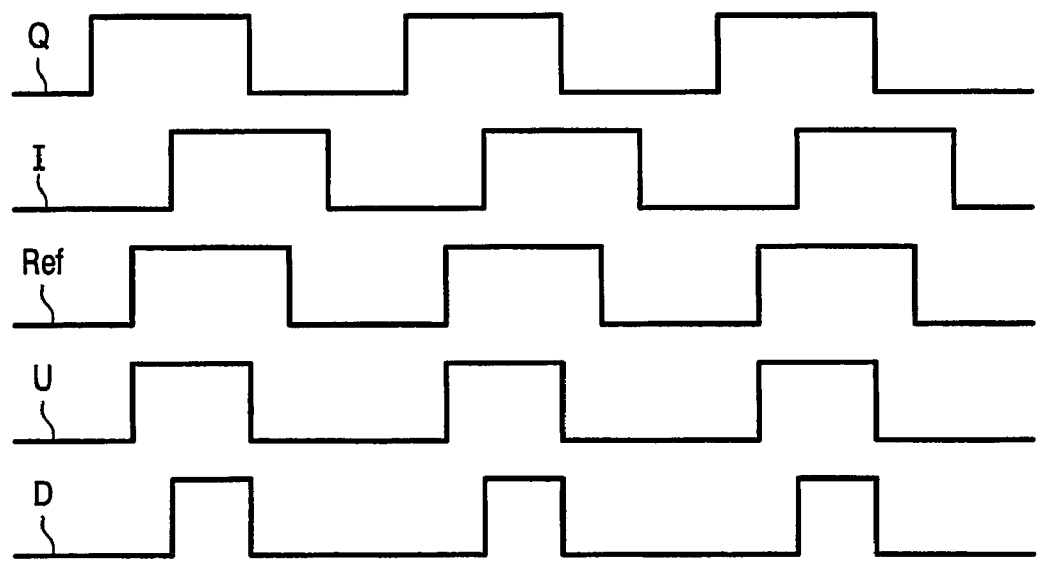

The operation principle of the phase detector 100 is better explained using FIG. 3 which depicts the response of the phase detector 100 to a phase error when a) the signal I leads the reference signal and b) when the signal I lags the reference signal. The FIG. 3 shows that the length of the D pulse is constant and depends only on the phase difference between I and Q. The information provided by the phase detector 103 is the up U signal, whose length depends on the phase error of the PLL. When the up U and down D signals are supplied to the first charge pump 201, the charge that is pumped in the PLL loop filter 203 is linearly dependent on the phase difference for phase differences around zero degrees. This results from FIG. 4a), where the mean charge pump current is plotted as a function of the PLL input phase difference. These graphs show that the gain of the phase detector 100 and the first charge pump 201

$$\frac{I_{CP}}{2\pi},$$

with $I_{CP}$ being the maximum charge pump current. Because of the integrating action of the first charge pump 201 and loop filter 203, the PLL locks to a phase error of 0 degrees between the rising edge of the reference and the rising edge of the I signal, as indicated in FIG. 4. Because the U and D pulses and the corresponding first charge pump 201 currents cancel when PLL is locked, the reference breakthrough is small resulting low spurious peaks, similar to the case in which a conventional phase—frequency detector is used.

In FIG. 4a), the dependence of the phase detector and the first charge pump 201 response on the quadrature quality is shown. Although the range in which the phase detector is linear is affected by the phase shift between Q and I signals, the phase detector gain is not affected, as is the locking point of the PLL. The reason for this situation is that the phase detector effectively measures the time difference between the rising edges of the reference signal Ref and I signal. The 'resetting' of the U and D signals is done in both AND-gates by a common falling edge of the signal Q. The linear region ranges from $\Delta\Phi_q-\pi<\Delta\Phi<\Delta\Phi_q$, where $\Delta\Phi_q$ is the phase difference between the signals I and Q and $\Delta\Phi$ is the phase error of the PLL. In case of ideal quadrature i.e. the signals I,Q are relative phase shifted with 90 degrees, the linear range is between $$-\frac{\pi}{2} \text{ and } \frac{\pi}{2}.$$

Figure 4B:
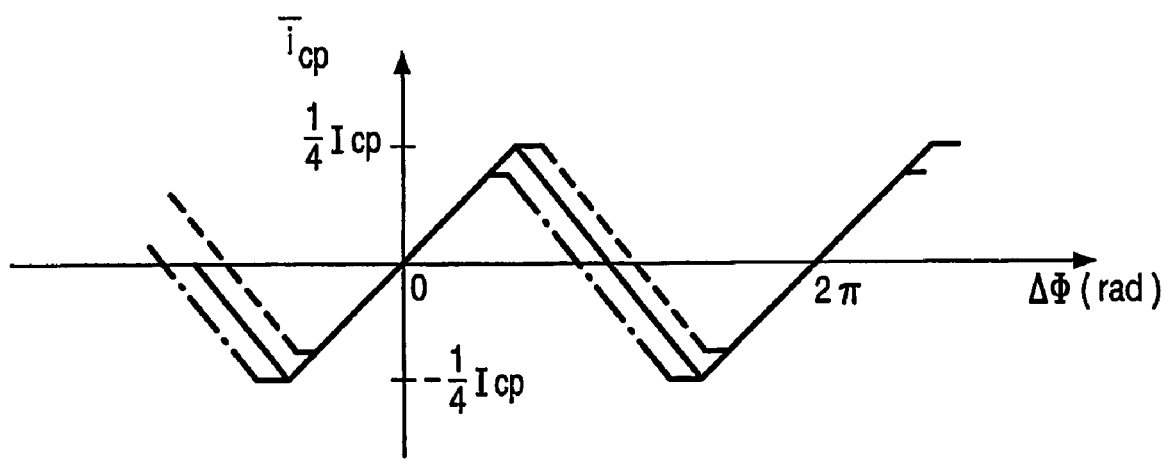

From FIG. 4b) one can conclude that the gain and the PLL phase error in lock also do not depend on the Duty Cycle of the reference signal Ref. The same holds for the dependence on the Duty Cycles of I and Q, although this is not plotted here. The linear region is affected by Duty Cycle deviations. For a reference Duty Cycle lower than 50%, the linear region is between $$-\frac{\pi}{2} < \Delta\Phi < 2\pi(DC-1/4),$$

with DC being the reference Duty Cycle. If DC>50% then the linear region is between $$2\pi(3/4 - DC) < \Delta\Phi < \frac{\pi}{2}.$$

Let us note that for correct operation of the phase detector 100, the reference Duty Cycle could be between circa 25% and 75%. In case of a Duty Cycle of 50%, the linear range is between $$-\frac{\pi}{2} \text{ and } \frac{\pi}{2}.$$

In almost all applications of the proposed phase detector 100, the dependence of the linear region on the signal Duty Cycles and on the quadrature quality is not a problem.

Let us note that in the paper "A 0.2–2 GHz, 12 mW Multiplying DLL for Low-Jitter Clock Synthesis in Highly Integrated Data Communication Chips" written by R. Farjad-rad et al. and published in ISSCC Dig. Tech. Papers, pp. 76–77, February 2002, a Phase Detector is presented that on first sight may look somewhat similar in design to the proposed phase detector 100. However, in that work, the length of the U and D pulses approaches zero when the PLL is in lock. Because neither the output voltages of the AND-gates nor the current sources of the Charge Pump are infinitely fast, the structure proposed there has a dead-zone problem. This means that the gain of the phase detector/charge pump combination drops significantly around zero degrees phase difference. The phase detector 100 disclosed in the present application does not have this problem as the U and D signals have a Duty Cycle of about 25% when the PLL is locked, because there is overlap between the signals on the AND-gates. In the previous cited document, three-input AND-gates are used, which are generally slower than two-input AND-gates as used in the proposed phase detector 100. Furthermore, the solution presented in the prior-art document involves using differential signals i.e. relatively phase-shifted with 180 degrees, an additional select logic circuit and an additional multiplexer, the circuit being more expensive than the circuit disclosed in the present application. Additionally, there is no equivalence between the signals used in the prior-art phase detector and the phase detector of this application.

As resulted from the previous considerations, the ideal phase shift between the signals Q and I is 90 degrees i.e. the signals are in quadrature. Obtaining quadrature signals could be realized in different modes.

FIG. 5 depicts a signal splitter according to an embodiment of the invention. The splitter 103 comprises a binary divider 113 that receives a signal generated by the voltage controlled oscillator 102. The splitter 103 generates a binary signal used as a clock signal for a divide by two circuit comprising a first bi-stable circuit Q1, D1, $\overline{Ck1}$ ring-coupled to a second bi-stable circuit Q2, $\overline{Q2}$, D2, Ck2 for generating the relative phase shifted signals I, Q. The bi-stable circuits could be e.g. D flip-flops or D latches. It should be pointed out here that the first and the second bi-stable circuits could be the last two stages of the frequency divider 113. The signals I and Q are substantially in quadrature and therefore the PLL is substantially linear.

FIG. 6 depicts another embodiment of the signal splitter 103 according to the invention. The splitter 103 comprises a series coupling of a delay line 110 and an inverter 111.

FIG. 7 depicts a frequency detector according to an embodiment of the invention. The frequency detector 104 comprises a third flip-flop D3, Q3, Ck3 and a fourth flip-flop D4, Q4, $\overline{Q4}$, Ck4 driven by the reference signal Ref. The third and the fourth flip-flops have at their inputs D3, D4 the relative phase shifted signals I, Q. The outputs of the flip-flops Q3, Q4 are coupled to input terminals D5, Ck5 of a fifth flip-flop D5, Ck5, Q5, $\overline{Q5}$. The phase detector 104 generates the up frequency detector signal UFD obtained by binary multiplication between a signal generated by the fifth flip-flop D5, Ck5, Q5, $\overline{Q5}$ at it's output Q5 and the signal obtained at the bar-output $\overline{Q4}$ of the fourth flip-flop D4, Ck4, Q4, $\overline{Q4}$. The frequency detector 104 further generates the down frequency detector signal DFD obtained by binary multiplication of the signal obtained at the bar-output $\overline{Q4}$ of the fourth flip-flop D4, Ck4, Q4, $\overline{Q4}$ and the signal obtained at the bar-output $\overline{Q5}$ of the fifth flip-flop signal obtained at the bar-output $\overline{Q4}$ of the fourth flip-flop D5, Ck5, Q5, $\overline{Q45}$. A bar-output signal is relatively in anti-phase with the output signal generated by an output having no bar. Many combinatorial and sequential circuits have a normal and a bar-output e.g. multiplexers, flip-flops etc. Two AND-gates are added to generate signals that can directly control the first charge pump 201. After achieving phase lock, these signals will remain low, meaning that the first charge pump 201 controlled by these signals do not contribute in the phase noise and spurious signals of the PLL output.

FIG. 8 depicts the charge pumps and the loop filter, according to the invention. The block identified as 101 in FIG. 1 comprises a first charge pump 201 and a second charge pump 202 coupled to a loop filter 203. The switches included in the first charge pump are controlled by the relative phase shifted signals U and D and the switches included in the second charge pump 202 are controlled by the signals UFD and DFD, respectively. Furthermore, the current first charge pump 201 current $I_{CP}$ used in the previous relations, is identified. The loop filter 203 has a low-pass structure, the signal supplied by the first charge pump 201 and the second charge pump 202 having different entries in the loop filter 203. The loop filter 203 supplies a signal to the VCO 102 said signal depending on the signals U, D, UFD and DFD and therefore being dependent on the phase and frequency difference between the reference signal Ref and the relative phase shifted signals I and Q. It could be observed that a PLL could have only a phase detector. In this situation the second charge pump 202 and the frequency detector 104 are no longer necessary.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. A phase looked loop comprising a phase detector for determining a phase difference between a reference signal and relative phase shifted signals to generate frequency control signals the phase detector comprising: means for obtaining a one of said frequency control signals by binary multiplication of the reference signal and one of the relative phase signals; means for obtaining a second one of said frequency control signals by binary multiplication of the relative phase shifted signals; a frequency detector coupled to receive the reference signal and the relative phase shifted signals for supplying an up frequency detector signal and a down frequency detector signal to a charge pump that is coupled to a loop filter, wherein the frequency detector comprises a third flip-flop and a fourth flip-flop driven by the reference signal and having at their inputs the relative phase signals, outputs of the third and fourth flip-flops being coupled to input terminals of a fifth flip-flop the frequency detector generating the up frequency detector signal obtained by binary multiplication between a signal generated by the fifth flip-flop at its output and the signal obtained at the bar-output of the fourth flip-flop, and further generating the down frequency detector signal obtained by binary multiplication of the signal obtained at a bar-output of the fourth flip-flop and the signal obtained at a bar-output of the fifth flip-flop signal obtained at the bar-output of the fourth flip-flop.

2. For use in a phase locked loop having a reference signal and relative phase shifted signals, a method for generating frequency control signals used by a first charge pump and an up frequency detector signal and a down frequency detector signal for a second charge pump communicatively coupled to a loop filter, the method comprising:

obtaining one of said frequency control signals by binary multiplication of the reference signal and one of the relative phase signals;

obtaining a second one of said frequency control signals by binary multiplication of the relative phase shifted signals; and obtaining the up and down frequency detector signals using a first, second and third flip-flop each of the first and second flip-flops communicatively coupled to the reference signal and to a different one of the relative phase shifted signals and the third flip-flop communicatively coupled to an output of the first flip-flop and an output of the second flip-flop, wherein the reference signal drives the first and second flip-flops, the relative phase signals drive inputs of the first and second flip-flops, the outputs of the first and second flip-flops being coupled to input terminals of the third flip-flop, the up frequency detector signal is obtained by binary multiplication between a signal generated by the third flip-flop at its output and a signal obtained at a bar-output of the second flip-flop, and the down frequency detector signal is obtained by binary multiplication of the signal obtained at the bar-output of the second flip-flop and a signal obtained at a bar-output of the third flip-flop signal obtained at the bar-output of the second flip-flop.

\* \* \* \* \*